US012646349B2

(12) United States Patent
Hsieh et al.

(10) Patent No.: US 12,646,349 B2
(45) Date of Patent: Jun. 2, 2026

(54) OPTICAL FINGERPRINT SENSOR WITH ENHANCED ANTI-COUNTERFEITING FEATURES

(71) Applicant: Taiwan Semiconductor Manufacturing Company, Ltd., Hsinchu (TW)

(72) Inventors: Feng-Chien Hsieh, Pingtung County (TW); Yun-Wei Cheng, Taipei City (TW); Kuo-Cheng Lee, Tainan City (TW); Cheng-Ming Wu, Tainan City (TW); Wei-Li Hu, Tainan City (TW)

(73) Assignee: TAIWAN SEMINCONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/785,921

(22) Filed: Jul. 26, 2024

(65) Prior Publication Data

US 2024/0386743 A1     Nov. 21, 2024

Related U.S. Application Data

(62) Division of application No. 18/187,891, filed on Mar. 22, 2023, now Pat. No. 12,277,795.

(Continued)

(51) Int. Cl.
*G06V 40/13* (2022.01)
*G06V 40/12* (2022.01)

(Continued)

(52) U.S. Cl.
CPC ...... *G06V 40/1318* (2022.01); *G06V 40/1353* (2022.01); *G06V 40/1365* (2022.01);
(Continued)

(58) Field of Classification Search
CPC ........... G06V 40/1318; G06V 40/1353; G06V 40/1365; G06V 40/1324; H10F 39/198;
(Continued)

(56) References Cited

U.S. PATENT DOCUMENTS 9,437,633 B2     9/2016   Chao et al.
9,508,769 B1 *   11/2016  Li ....................... H10F 39/8053
(Continued)

FOREIGN PATENT DOCUMENTS

CN        111368120 A       7/2020
CN        111316287 B       5/2021
(Continued)

*Primary Examiner* — Antonio Xavier
(74) *Attorney, Agent, or Firm* — HAYNES AND BOONE, LLP

(57)     ABSTRACT

A method of fingerprint verification includes capturing a fingerprint image by an image sensing device. The image sensing device including a pixel array of a combination of sensing pixels configured to capture minutia points in the fingerprint image and positioning pixels configured to provide positioning codes. The method further includes calculating vectors of the minutia points with reference to the positioning codes, comparing the vectors to reference vectors generated from a reference fingerprint image, and determining a match between the fingerprint image and the reference fingerprint image based on the comparing of the vectors.

20 Claims, 12 Drawing Sheets

Related U.S. Application Data

(60) Provisional application No. 63/382,143, filed on Nov. 3, 2022, provisional application No. 63/389,292, filed on Jul. 14, 2022.

(51) Int. Cl.
 H10F 39/00 (2025.01)
 H10F 39/12 (2025.01)

(52) U.S. Cl.
 CPC ....... H10F 39/198 (2025.01); H10F 39/8053 (2025.01); H10F 39/8057 (2025.01); H10F 39/8063 (2025.01)

(58) Field of Classification Search
 CPC ............. H10F 39/8053; H10F 39/8057; H10F 39/8063
 See application file for complete search history.

(56) References Cited

U.S. PATENT DOCUMENTS

| | | | |
|---|---|---|---|
| 9,564,468 | B2 | 2/2017 | Chou et al. |
| 10,824,821 | B2 | 11/2020 | Suwald |
| 10,878,073 | B2 | 12/2020 | Huang et al. |
| 2008/0279416 | A1* | 11/2008 | Lo ..................... G06V 40/1365 382/100 |
| 2010/0284565 | A1 | 11/2010 | Benkley |
| 2015/0294131 | A1* | 10/2015 | Neskovic ........... G06V 40/1335 382/125 |
| 2017/0054924 | A1 | 2/2017 | Chuang et al. |
| 2017/0140207 | A1* | 5/2017 | Zhu .................... G06V 40/1371 |
| 2019/0333950 | A1 | 10/2019 | Chiang et al. |
| 2020/0175244 | A1 | 6/2020 | Liao |
| 2020/0387686 | A1 | 12/2020 | Jhang et al. |
| 2021/0224574 | A1* | 7/2021 | Yang .................. G06V 40/1353 |
| 2021/0279990 | A1 | 9/2021 | Chen et al. |
| 2021/0391361 | A1 | 12/2021 | Huang et al. |
| 2022/0052090 | A1* | 2/2022 | Kao ..................... H10F 39/806 |
| 2022/0102397 | A1 | 3/2022 | We et al. |
| 2022/0223635 | A1 | 7/2022 | Kao et al. |
| 2023/0334898 | A1* | 10/2023 | Xue ..................... H04M 1/026 |
| 2023/0402485 | A1* | 12/2023 | Borremans ........... H10F 39/182 |

FOREIGN PATENT DOCUMENTS

| | | | |
|---|---|---|---|
| CN | 112992941 | A | 6/2021 |
| CN | 113537118 | A | 10/2021 |
| CN | 113569661 | A | 10/2021 |
| KR | 20190036194 | A | 4/2019 |
| TW | 201319888 | A | 5/2013 |
| TW | 1549065 | B | 9/2016 |
| TW | 1582678 | B | 5/2017 |
| TW | 1619080 | B | 3/2018 |
| TW | M618757 | U | 10/2021 |
| TW | 202205152 | A | 2/2022 |
| TW | 202220117 | A | 5/2022 |

* cited by examiner

900

902 — Display a prompt on screen

904 — User holds finger steady for more than the predetermined time — NO

906 — Illuminate Sensing Region

908 — Filter stray light at collimator

910 — Acquire fingerprint image at image sensors

912 — Calculate vectors from minutia points of the fingerprint image and positioning codes 914 — Vectors are matched — NO / YES 916 — Unlock device

OPTICAL FINGERPRINT SENSOR WITH ENHANCED ANTI-COUNTERFEITING FEATURES

PRIORITY DATA

This is a divisional application of U.S. patent application Ser. No. 18/187,891, filed Mar. 22, 2023, which claims priority to U.S. Provisional Patent Application Ser. No. 63/389,292, filed on Jul. 14, 2022, and U.S. Provisional Patent Application Ser. No. 63/382,143, filed on Nov. 3, 2022, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. For example, there is considerable interest in providing consumer and/or portable electronic devices (e.g., smart phones, electronic tablets, wearable devices, and so on) with fingerprint sensing applications (e.g., optical sensors for fingerprint recognition) inside limited device housing without compromising security level provided by fingerprint sensing applications.

In some fingerprint sensing applications, fingerprint grayscale level images are sensed by pixels of an optical fingerprint sensor that can only sense grayscale level images (i.e., cannot sense color images). Further, such grayscale level images do not include any special positioning codes or patterns. Such fingerprint sensing applications are susceptible to counterfeiting. Therefore, conventional means of optical fingerprint sensors are not satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
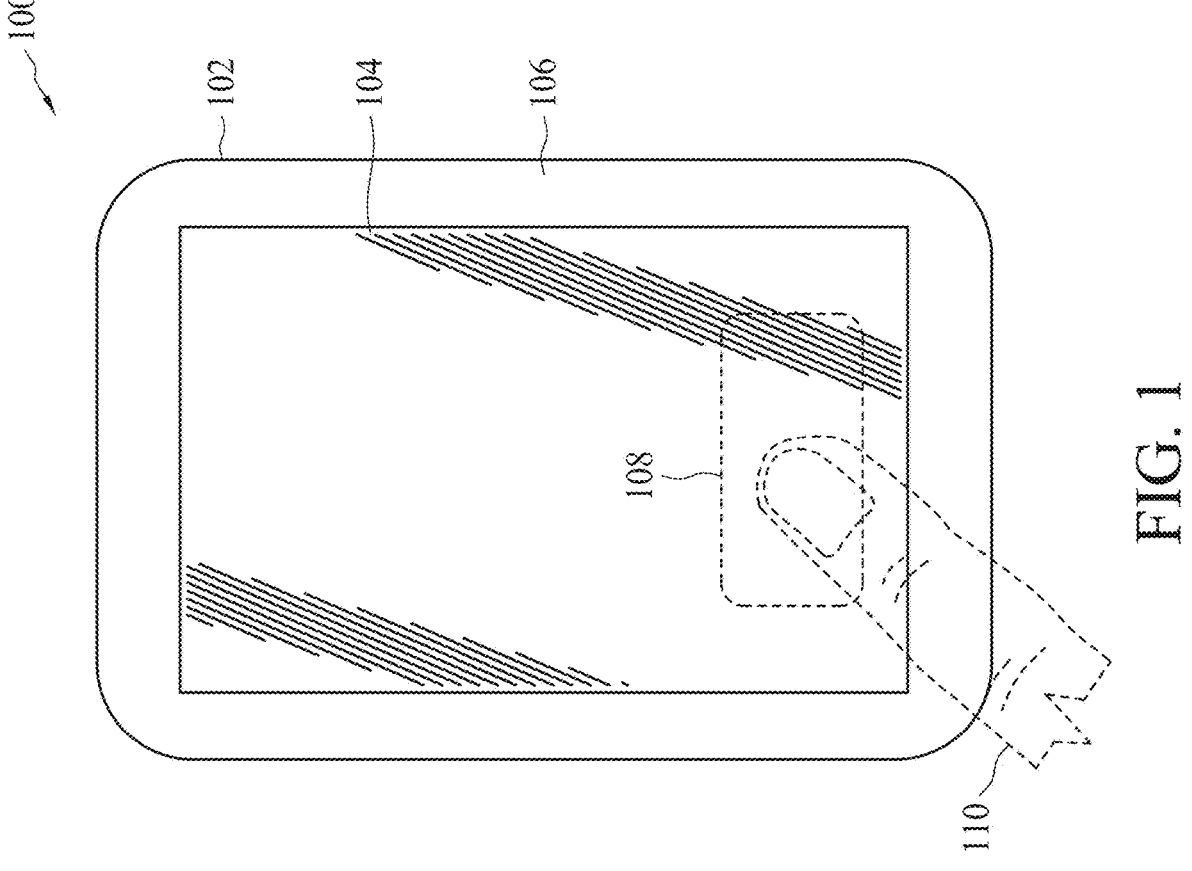
FIG. 1 illustrates an electronic device with a fingerprint sensing region on surface space, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The present disclosure is generally related to designs and methods for fingerprint sensing, such as in anti-counterfeiting applications which utilize optical fingerprint sensor (abbreviated as OFPS). More particularly, some embodiments are related to integrating special patterns of positioning pixels (also referred to as positioning codes) and/or extra color pixels for adding skin tone codes to an OFPS for enhancing anti-counterfeiting capabilities of an OFPS.

OFPS is one approach of biometric sensing that draws considerable interest to provide security features to electronic devices, and more particularly, consumer and/or portable electronic devices (e.g., smart phones, electronic tablets, wearable devices, and so on). An OFPS-based fingerprint recognition (or fingerprint sensing) system is based on unique features of a user and may not rely on memorization or the use of other input devices by the user, such as password input. An OFPS-based fingerprint recognition system also provides the advantage of being difficult to hack for the same reason.

Among various biometric sensing techniques, fingerprint recognition is a reliable and widely used technique for personal identification or verification. A fingerprint recognition system generally includes fingerprint sensing and matching functionalities, such as collecting fingerprint images and comparing those images against known fingerprint information. In particular, one approach to fingerprint recognition involves scanning a reference fingerprint and storing the reference image acquired. The characteristics of a new fingerprint may be scanned and compared to the reference image already stored in a database to determine proper identification of a person, such as for verification purposes. A fingerprint recognition system may be particularly advantageous for authentication in consumer and/or portable electronic devices. For example, an optical sensor for acquiring fingerprint images may be carried inside the housing of an electronic device.

The effectiveness of biometric security systems may be affected by the accuracy with which the unique biometric data is able to be detected. In the case of fingerprint recognition systems, this means improving accuracy when comparing an acquired fingerprint image to a reference fingerprint image stored in a database. What is stored in a database as a representation of a reference fingerprint image is often a collection of minutia points representing ridges and valleys of a fingerprint. Such a collection of minutia points is also referred to as a minutia map. If a minutia map is hacked or leaked, the fingerprint image can be rebuilt by reserve engineering. The security provided by a fingerprint recognition system is thus compromised. In some embodiments of the present disclosure, positioning pixels are added to a pixel array of an OFPS to add additional codes to a minutia map. Such codes are referred to as fingerprint positioning codes or position reference codes. The fingerprint positioning codes turns a direct recordation of minutia points of where ridges and valleys locate to vectors representing relative locations of minutia points with respect to positioning pixels. Thus, even a minutia map is hacked or leaked, without knowledge of distributions of positioning pixels and how the positioning pixels are referenced to, a fingerprint image still cannot be rebuilt from the minutia map. Thus, adding positioning codes enhances anti-counterfeiting capability of an OFPS.

Further, in some fingerprint sensing applications, fingerprint grayscale level images are sensed by image sensing pixels (abbreviated as pixels) that can only sense the grayscale level image (i.e., cannot sense color images). Such pixels are referred to as grayscale pixels or "W" pixels. For example, monochromatic image sensors are often adapted as pixels for fingerprint recognition applications, which produces grayscale level images. In some embodiments of the present disclosure, one or more color image sensors are added to the pixel array as color pixels (RGB), thereby adding fingerprint color codes representing skin tones to the reference and acquired fingerprint images. The fingerprint color codes further enhance anti-counterfeiting capability of an OFPS. In various embodiments, positioning pixels producing fingerprint positioning codes and color pixels producing fingerprint color codes may be independently or jointly applied to a pixel array of an OFPS. For example, an OFPS may include a pixel array with some grayscale pixels replaced by positioning pixels, a pixel array with some grayscale pixels replaced by color pixels, a pixel array with some grayscale pixels replaced by positioning pixels and some grayscale pixels replaced by color pixels, or even a pixel array with no grayscale pixels but a combination of color pixels and positioning pixels.

FIG. 1 illustrates an electronic device 100 with a fingerprint sensing region on surface space, in accordance with some embodiments of the present disclosure. As shown in FIG. 1, the electronic device 100 is illustratively a mobile wireless communication device (e.g., a smart phone). In other embodiments, the electronic device 100 may be any other suitable electronic device, such as a laptop computer, an electronic tablet, a portable gaming device, a navigation device, or a wearable device. The electronic device 100 includes a housing 102 together with other components, such as processor(s) and memories, inside the housing 102. A display panel 104 is carried by the housing 102. In the illustrated embodiment, the display panel 104 is an organic light-emitting diode (OLED) display panel. In various embodiments, the display panel 104 may be any other suitable type display panel, as will be appreciated by those skilled in the art, such as liquid-crystal display (LCD) panel, light-emitting diode (LED) display panel, or active-matrix organic light-emitting diode (AMOLED) display panel.

In the illustrated embodiment, the display panel 104 expands substantially to the entire surface space of the electronic device 100. Some margins between the display panel 104 and edges of the housing 102 may be left for bezel panels 106. The display panel 104 stacks above image sensing features for fingerprint detection, or other suitable biometric sensing features. The image sensing features will be described further in details later. The display panel 104 acts as both a display and an input device through which the image sensing features acquires fingerprint images. As such, the display panel 104 performs multiple device functions in response to user input. For example, the display panel 104 may first display a prompt (e.g., a finger icon or an instruction text) on screen when the electronic device 100 is in a lock status. The display panel 104 may further highlight a sensing region 108. When a user's finger 110 is placed inside the sensing region 108, in either near field or in direct contact with the display panel 104, the image sensing features are activated and acquire a fingerprint image from the user's finger 110. Such acquired fingerprint image (biometric data) is sent to processor(s) for matching and/or spoof detection. If the acquired fingerprint image matches a reference fingerprint image stored in memories, the electronic device 100 may thereafter transit into an unlock status, and the display panel 104 starts to show desktop icons or response to various other user inputs. The display panel 104 may further integrate with touch sensor arrays. In such case, the display panel 104 is also a touch display panel.

Figure 2:
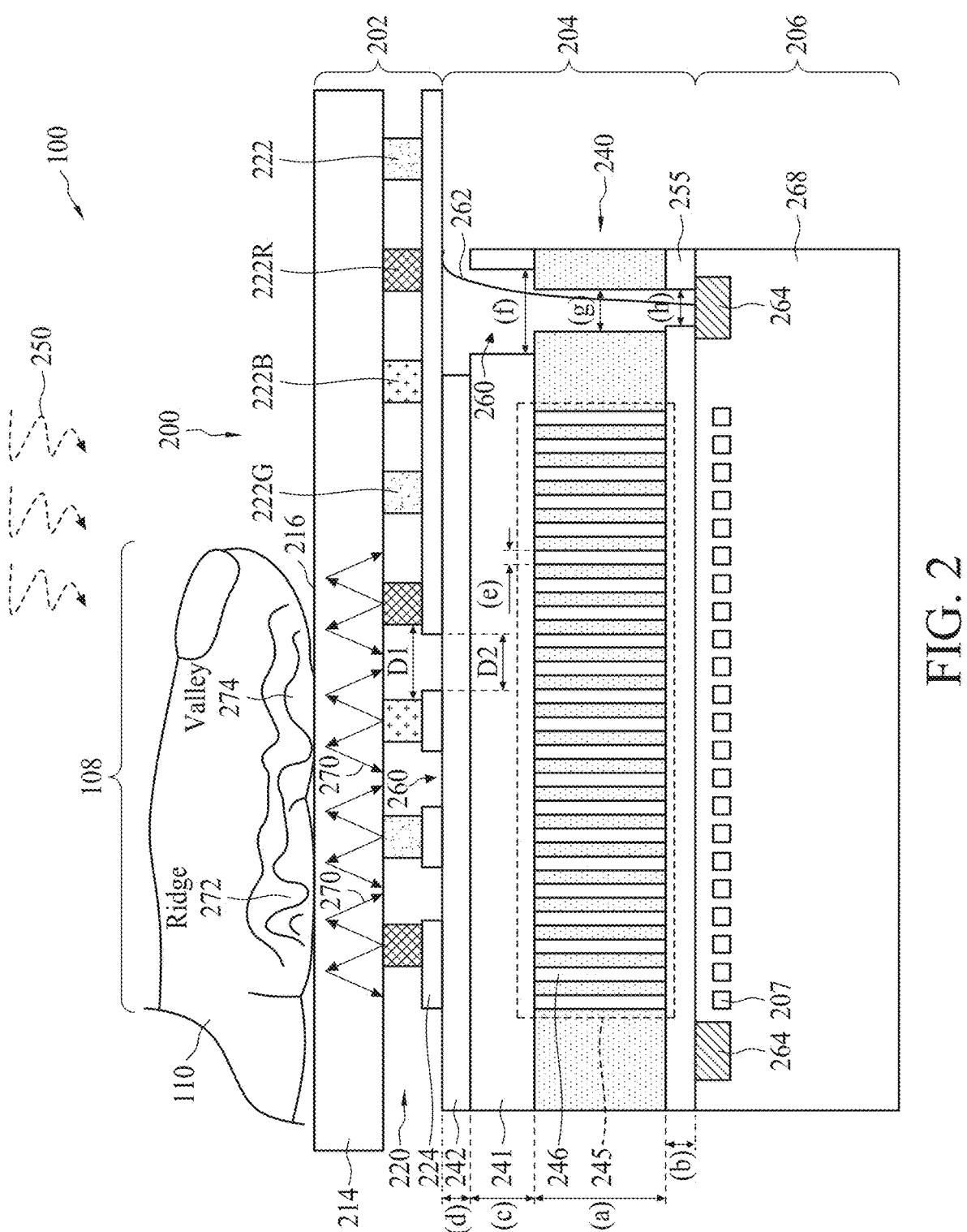
FIG. 2 is a cross-sectional view of an electronic device integrated with an optical fingerprint sensor under a display panel, according to various aspects of the present disclosure.

FIG. 2 is a cross-sectional view of a portion of the electronic device 100. This portion of the electronic device 100 carries the fingerprint recognition function and can be regarded as a fingerprint recognition system 200. The fingerprint recognition system 200 is in a stack-up configuration, including a display panel 202 on the top, a light conditioning layer 204 in the middle, and an OFPS 206 at the bottom. The display panel 202 illuminates the sensing region 108 above. When light emitted from the display panel 202 is reflected from the user's finger 110, the reflected light travels downwardly through the display panel 202 and the light conditioning layer 204 and eventually arrives at the OFPS 206. In one embodiment, the image OFPS 206 includes an array of optical sensing elements 207, such as complementary metal oxide semiconductor (CMOS) image sensors and/or charged coupled device (CCD) sensors. The optical sensing elements 207 are capable of detecting intensities of the incident light. The OFPS 206 thereby convers the incident light into a pixel image, which includes biometric characteristics of the user's finger 110. Each pixel of the pixel image may correspond to intensity of the incident light recorded at a corresponding location of an optical sensing element 207.

In some embodiments, the display panel 202 includes a cover glass 214 (or cover lens) that protects inner components of the electronic device 100. The sensing region 108 is defined above the cover glass 214. A top surface 216 of the cover glass 214 forms a sensing surface, which provides a contact area for the user's finger 110 or other suitable objects. Inside the sensing region 108, the user's finger 110 may directly touch the top surface 216 or keep a small distance away from the top surface 216 as during a near field sensing. The cover glass 214 may be made of glass, transparent polymeric materials, or other suitable materials.

The display panel 202 includes an illumination layer or display layer 220 under the cover glass 214. The display layer 220 includes an array of light emitting pixels 222. Different light emitting pixels 222 may be configured to emit different colors, such as the ones emitting red light, the ones emitting green light, or the ones emitting blue light. Due to geometry relationships with the sensing region 108, the light emitting pixels 222 can be categorized into two groups, one group directly under the sensing region 108 and another group outside of the sensing region 108. The light emitting pixels 222 outside of the sensing region 108 perform regular display functions, while the light emitting pixels 222 directly under the sensing region 108 perform both regular display functions and illumination function during biometric sensing, depending on applications. In various embodiments, pixel distance D1 between adjacent light emitting pixels 222 is in a range from about 5 micrometers to about 30 micrometers, where other values and ranges are within the scope of this disclosure. In a specific example, the pixel distance D1 may be in a range from about 10 micrometers to about 20 micrometers.

In some embodiments, the display panel 202 further includes a blocking layer 224. The blocking layer 224 is a semitransparent or opaque layer that may be disposed below the display layer 220. Outside of the sensing region 108, the blocking layer 224 is continuous, obscuring components under the display layer 220 from the light emitted by the light emitting pixels 222 and from ambient light. Directly under the sensing region 108, the blocking layer 224 has a plurality of openings 226. Each opening 226 locates between two adjacent light emitting pixels 222. The openings 226 allow the light reflected from the sensing region 108 to travel through. In the illustrated embodiment, there is one opening 226 located between two adjacent light emitting pixels 222. The opening 226 may have a width (or diameter) D2 in a ratio to the pixel distance D1 from about 40% to about 90%, where other values and ranges are within the scope of this disclosure. In some other embodiments, there are two or more openings 226 located between two adjacent light emitting pixels 222. The opening 226 may thus have a width (or diameter) D2 in a ratio to the pixel distance D1 from about 20% to about 40%.

In various embodiments, the display layer 220 may be an LCD display (using backlight with color filters to form RGB pixels), a LED display (e.g., a microLED, in which the pixel material can be inorganic material used in LED), an OLED display, or any other suitable displays. In the illustrated embodiment, the light emitting pixels 222 are organic light emitting diodes (OLED) and the display layer 220 is an OLED display. Examples of an OLED display may include active-matrix OLED (AMOLED), passive-matrix OLED (PMOLED), white OLED (WOLED), and RBG-OLED, and/or other suitable types of OLED. An OLED display is usually thinner, lighter, and more flexible than other types of displays, such as LCD or LED displays. OLED display does not require a back light, since the light can be generated from the organic light emitting material in an OLED, which allows a pixel to be turned completely off. The organic light emitting material can be an organic polymer, such as poly-phenylenevinylene and polyfluorene. Due to the organic light emitting material producing its own light, the OLED display can also have a wider viewing angle. This can be in comparison to an LCD display, which works by blocking light that can lead to obstruction of certain viewing angles.

The OLED diodes emit light using a process called electroluminescence, which is a phenomenon where the organic light emitting material can emit light in response to an electric current passing through. In some examples, the OLED diodes can include hole injection layers, hole transport layers, electron injection layers, emissive layers, and electron transport layers. The color of light emitted by an OLED diode depends on the type of organic light emitting material used in the emissive layer. Different colors can be obtained with a variety of chemical structures of the organic light emitting material. The intensity of light can depend on the number of emitted photons or the voltage applied on the OLED diodes. In some embodiments, each light emitting pixel is formed with the same organic light emitting material that generates white light, but further includes a red, green, or blue color filter to filter out colors other than the target color, respectively. The color filter can be formed using a cholesteric filter material such as a multilayer dielectric stack that includes materials with different indices of refraction configured to form an optical filter.

As shown in FIG. 2, under the sensing region 108, the light conditioning layer 204 is stacked under the display panel 202. The light conditioning layer 204 includes a semiconductor layer 240 and an optical filtering film 242. In one embodiment, the semiconductor layer 240 comprises a silicon microelectromechanical systems (MEMS) structure. For example, the semiconductor layer 240 comprises a collimator 245 including an array of apertures 246. Each aperture 246 is directly above one or more optical sensing elements 207 in the OFPS 206. The array of apertures 246 may be formed by any suitable techniques, such as plasma etching, laser drilling, or the like. The array of apertures 246 conditions incident light reflected from the sensing region 108. With the OFPS 206 stacked at the bottom, the display panel 202, especially the relative thick cover glass 214, adds extra vertical distance between the user's finger 110 and the OFPS 206, which causes stray light from nearby regions of the user's finger 110 also arrives an optical sensing element 207 together with the light from a small spot directly above. The stray light contributes to image blurring. The array of apertures 246 helps filtering out the stray light and substantially only allows the light from the small spot directly above to be detected, resulting in sharper images.

A metric of the collimator 245 is an aspect ratio of the aperture 246, defined as the height (a) divided by the diameter (e) of the aperture 246. The aspect ratio of the aperture 246 is sufficiently large to allow light rays at normal or near normal incidence to the collimator 245 to pass and reach the optical sensing element 207. Examples of suitable aspect ratio of the aperture 246 are ranging from about 5:1 to about 50:1 and sometimes ranging from about 10:1 to about 15:1. Other values and ranges are within the scope of this disclosure. In an embodiment, the height (a) of the aperture 246 is in a range from about 30 micrometers to 300 micrometers, such as about 150 micrometers. In various embodiments, the collimator 245 may be an opaque layer with array of holes. In some embodiments, the collimator 245 is a monolithic semiconductor layer, such as a silicon layer. Other examples of the collimator 245 may include plastics such as polycarbonate, PET, polyimide, carbon black, inorganic insulating or metallic materials, or SU-8.

As shown in FIG. 2, the light conditioning layer 204 also includes the optical filtering film 242 above the semiconductor layer 240. The optical filtering film 242 selectively absorbs or reflects certain spectrums of incident light, especially components from the ambient light 250, such as infrared light and/or a portion of other visible light (e.g., red light). The optical filtering film 242 helps reducing the optical sensing element 207's sensitivity to ambient light 250 and increasing its sensitivity to the light emitted from the light emitting pixels 222. The optical filtering film 242 may extend continuously and directly above the collimator 245, and have an opening 260 outside of the collimator 245.

In an example, the optical filtering film 242 may include a thin metal layer or a metal oxide layer that absorbs or reflects light in certain spectrums. In another example, the optical filtering film 242 may include dye(s) and/or pigment(s) that absorb or reflect certain light components. Alternatively, the optical filtering film 242 may include several sub-layers or nano-sized features designed to cause interference with certain wavelengths of incident light. In one embodiment, the optical filtering film 242 may include one or more materials like a silicon oxide, a titanium oxide, or another metal oxide.

The optical filtering film 242 may be deposited on a dielectric layer 241, which may be a buried oxide layer on the semiconductor layer 240. In one embodiment, the buried oxide layer 241 may include one or more materials like a thermal oxide, a plasma enhanced oxide (PEOX), a high-density-plasma (HDP) oxide, etc. In addition, the light conditioning layer 204 also includes a passive oxide layer 255 below the semiconductor layer 240. In one embodiment, the passive oxide layer 255 may include one or more materials like a PEOX, a HDP oxide, etc.

The OFPS 206 in this example includes a substrate 268, a plurality of optical sensing elements 207 in the substrate 268, and bond pads 264 in the substrate 268. Each bond pad may be a metal pad including conductive material. As shown in FIG. 2, the stack of the passive oxide layer 255, the semiconductor layer 240, the buried oxide layer 241 and the optical filtering film 242 may further have a few openings 260. The openings 260 allow some conductive features, e.g. bond wires 262, to interconnect at least one of the bond pads 264 on the top surface of the image sensing layer 206 to external circuits, such as a processor of the electronic device 100. The bond pads 264 route to control signal lines and power/ground lines embedded in the image sensing layer 206. The image sensing layer 206 may further include alignment marks for alignment control during fabrication and assembly. In other embodiments, the alignment marks are located at the passive oxide layer 255 or a metal/bond pad layer of the image sensing layer 206 for alignment control during fabrication and assembly.

In one embodiment, the semiconductor layer 240 has a thickness (a) of about 50 to 200 micrometers. In one embodiment, the passive oxide layer 255 has a thickness (b) of about 400 to 2000 nanometers. In one embodiment, the buried oxide layer 241 has a thickness (c) of about 1000 to 2000 nanometers. In one embodiment, the optical filtering film 242 has a thickness (d) of about 1 to 5 micrometers. In one embodiment, each aperture 246 of the collimator 245 has a diameter of about 5 to 30 micrometers. According to various embodiments, the openings 260 of the passive oxide layer 255, the semiconductor layer 240 and the buried oxide layer 241 have different diameters. For example, the opening of the buried oxide layer 241 has a diameter (f) of about 100 to 140 micrometers; the opening of the semiconductor layer 240 has a diameter (g) of about 80 to 120 micrometers; and the opening of the passive oxide layer 255 has a diameter (h) of about 60 to 100 micrometers.

In one embodiment, a method for capturing a fingerprint image from a user's finger illuminated by a display panel integrated with a light conditioning layer is described below. The screen of the electronic device 100 may be first in a lock status. A prompt is displayed, where the prompt may be an icon, such as a fingerprint icon or an instruction text, which highlights a sensing region 108 on the screen. The prompt is shown by light emitting pixels 222 under the sensing region 108. The light emitting pixels 222 can be OLED diodes. The light emitting pixels 222 outside of the sensing region 108 may be turned off in the lock status or display preset screen saver images. Then, when the user's finger 110 stays steady in the sensing region 108 for more than a predetermined time, such as the user holding a finger steady for about one hundred milliseconds, a biometric detection mode begins. Otherwise, the method goes back to wait for a new user input.

In the biometric detection mode, the prompt shown on the screen is turned off and the light emitting pixels 222 under the sensing region 208 start to illuminate the user's finger 110. The light 270 emitted from the light emitting pixels 222 can travel through the cover glass 214 and arrives at the user's finger 110. The user's finger 110 can include ridges 272 and valleys 274. The ridges 272 of the finger can reflect more light due to a closer distance to the top surface 216 than the valleys 274, and the valleys 274 can reflect less light. The light 270 is in turn reflected back towards the light conditioning layer 204.

Then, the optical filtering film 242 filters certain spectrums of light. In some embodiments, the optical filtering film 242 is an infrared light cut-off filter, which filters (or reduces) infrared light component from the incident light, such as by absorbing or reflecting. The ambient light 250, such as sunlight, is the major source of infrared light. The infrared light may easily penetrate the user's finger 110. Thus the infrared light does not carry useful information of biometric characteristics of the finger and can be considered as part of the noise. Blending the infrared light component from the ambient light with the reflected light from the light emitting pixels reduces the sensitivity of the optical sensing elements 207. By filtering the infrared light before sensing, signal-notice-ratio (SNR) of the incident light will be increased. In some other embodiments, the optical filtering film 242 may target light in certain spectrums other than infrared light, for example, red light in the visible spectrum or ultra-violet light. The light filtering profile of the optical filtering film 242 may be formulated to give a particular appearance of color, texture, or reflective quality thereby allowing for optimized filtering performance. In some embodiments, the optical filtering film 242 is an infrared light cut-off filter and there is a separate film stacked under or above for filtering red light to reduce ghost image.

Then the collimator 245 filters stray light components in the light 270. With high aspect ratio of the apertures 246, the collimator 245 only allows light rays reflected from the sensing region 108 at normal or near normal incidence to the collimator 245 to pass and eventually reach the OFPS 206. The optical sensing element 207 can be used to measure the intensity of light and convert the measured intensity into pixel image of the input object, such as the user's finger 110. On the other hand, stray light with a larger angle from normal, strike the collimator 245, either on its top surface or at surface within the apertures 246 (e.g., aperture sidewalls) and are blocked and prevented from reaching the image sensing layer 206 below. The aspect ratio of the apertures 246 is sufficiently large to prevent stray light from traveling through the collimator 245, such as from about 5:1 to about 50:1.

The OFPS 206 then acquires a fingerprint image. The optical sensing elements 207 inside the image sensing layer 206 can convert the incident light into electrical outputs. Each optical sensing element 207's output may correspond to one pixel in the fingerprint image. The optical sensing elements 207 may comprise monochromatic image sensors (grayscale pixels) and/or color image sensors (color pixels). In some embodiments, each of the optical sensing elements 207 may be configured to correspond with specific light wavelengths, such as a sensor element directly under a red light emitting pixel 222 for sensing a red light wavelength, a sensor element directly under a green light emitting pixel 222 for sensing a green light wavelength, and a sensor element directly under a blue light emitting pixel 222 for sensing a blue light wavelength.

The acquired fingerprint image is compared with an authentic reference image previously stored in a memory (or database). If the fingerprint images match, the screen is unlocked. The light emitting pixels 222 under the sensing region 108 will stop illumination and join the other light emitting pixels 222 outside of the sensing region 108 to start display regular desktop icons as in an unlock status. If the fingerprint images do not match, the method goes back to wait for new biometric detection.

Figure 3:
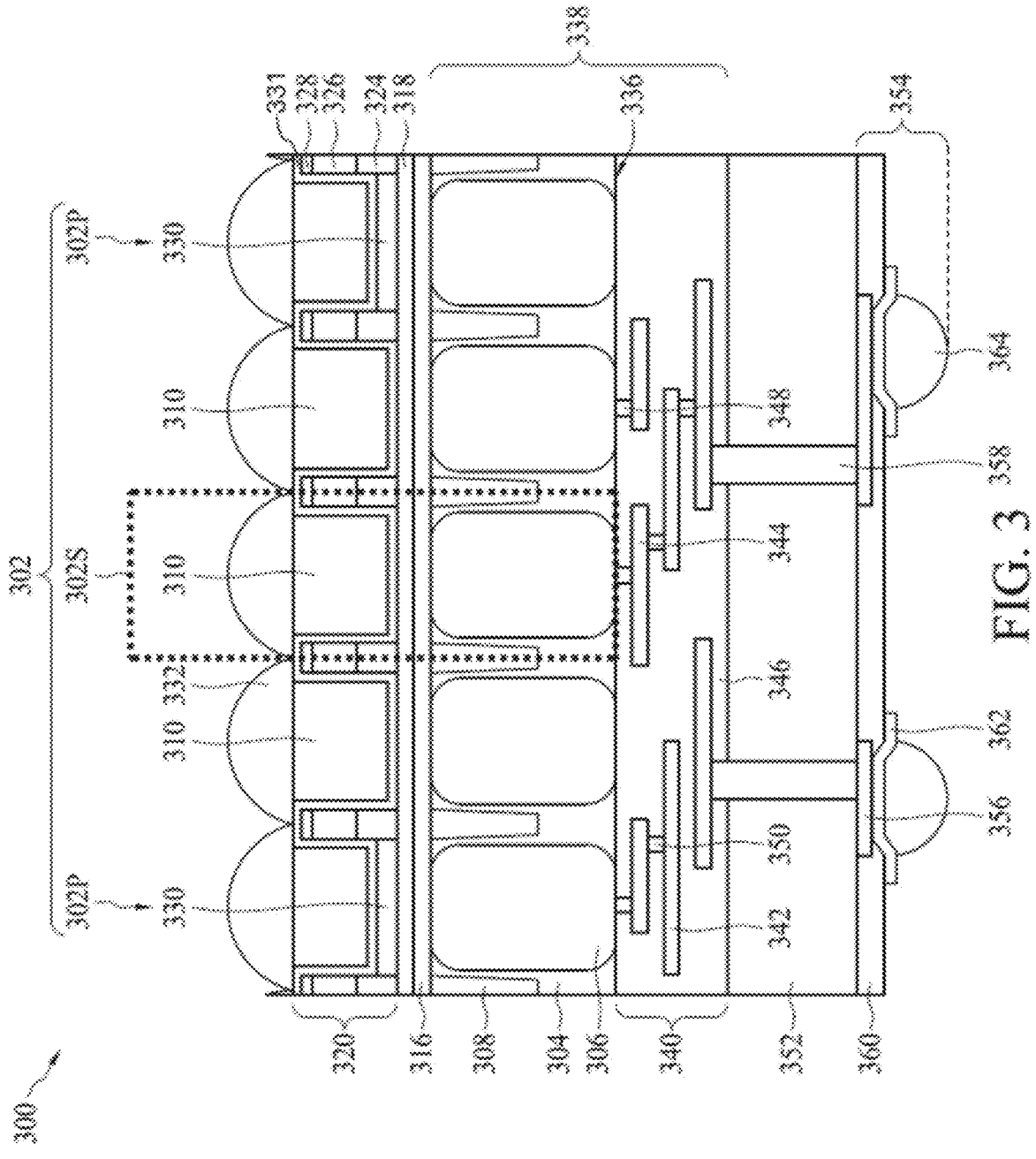
FIG. 3 is a cross-sectional view of an embodiment of the optical fingerprint sensor as shown in FIG. 2, according to various aspects of the present disclosure.

With reference to FIG. 3, a cross-sectional view of some embodiments of a semiconductor structure for an OFPS 300 is provided. The OFPS 300 may be substantially similar to the OFPS 206 discussed above with reference to FIG. 2. The OFPS 300 includes a pixel array 336 of image sensing pixels (abbreviated as pixels) 302 arranged in rows and columns. For example, the pixel array may include about 3 million pixels 302 arranged in 1536 rows and 2048 columns. The semiconductor structure includes a semiconductor substrate 304 within which photodiodes 306 corresponding to the pixels 302 are arranged. The photodiodes 306 are arranged in rows and/or columns within the semiconductor substrate 304, and configured to accumulate charge (e.g., electrons) from photons incident on the photodiodes 306. The semiconductor substrate 304 may be, for example, a bulk semiconductor substrate, such as a bulk silicon substrate, or a silicon-on-insulator (SOI) substrate.

A DTI region 308 defines a substrate isolation grid, made up of grid segments, such as individual rectangles or squares which abut one another. Further, the DTI region 308 extends into the semiconductor substrate 304 from about even with an upper surface of the substrate 304. The DTI region 308 is laterally arranged around and between the photodiodes 306 to advantageously provide optical isolation between neighboring photodiodes 306. The DTI region 308 may be, for example, a metal, such as tungsten, copper, or aluminum copper. Alternatively, the DTI region 308 may be, for example, a low-n material. A low-n material has a refractive index less than light filters 310 overlying corresponding ones of the pixels 302. The light filters 310 may be color filters for color pixels, transparent filters for monochromatic pixels (grayscale pixels), or a combination of color filters and transparent filters. In some embodiments, the DTI region 308 has a refractive index less than about 1.6. Further, in some embodiments, the DTI region 308 is a dielectric, such as an oxide (e.g., $SiO_2$) or hafnium oxide (e.g., $HfO_2$), or a material with a refractive index less than silicon.

An antireflective coating (ARC) 316, and/or a first dielectric layer 318, of the semiconductor structure are arranged over the semiconductor substrate 304 along an upper surface of the semiconductor substrate 304. In embodiments where both the ARC 316 and the first dielectric layer 318 are present, the first dielectric layer 318 is typically arranged over the ARC 316. The ARC 316 and/or the first dielectric layer 318 space the semiconductor substrate 304 from a composite grid 320 of the semiconductor structure that overlays the substrate 304. The first dielectric layer 318 may be, for example, an oxide, such as silicon dioxide.

The composite grid 320 is laterally arranged around and between the photodiodes 306 to define openings within which the light filters 310 are arranged. The openings correspond to the pixels 302 and are centrally aligned with the photodiodes 306 of the corresponding pixels 302. The composite grid 120 includes one or more of a metal grid 324, a low-n grid 326, and a hard mask grid 328 stacked in that order over the semiconductor substrate 304. Each grid 324, 326, 328 is made up of grid segments, such as individual rectangles or squares which abut one another to collectively make up the grid 324, 326, 328 and which surround respective photodiodes 306. Each grid 324, 326, 328 also includes openings between the grid segments and which overlie the photodiodes 306. The metal grid 324 blocks light from passing between neighboring pixels 302 to help reduce cross talk. The metal grid 324 may be, for example, tungsten, copper, or aluminum copper. The low-n grid 326 is a transparent material with a refractive index less than a refractive index of the light filters 310. Due to the low refractive index, the low-n grid 326 serves as a light guide to direct light to the light filters 310 and to effectively increase the size of the light filters 310. Further, due to the low refractive index, the low-n grid 326 serves to provide optical isolation between neighboring pixels 302. Light within the light filters 310 that strikes the boundary with the low-n grid 326 typically undergoes total internal reflection due to the refractive indexes. In some embodiments, the low-n grid 326 is a dielectric, such as an oxide (e.g., $SiO_2$) or hafnium oxide (e.g., $HfO_2$), or a material with a refractive index less than silicon. The hard mask grid 328 may be, for example, silicon nitride or silicon oxynitride.

The light filters 310 are arranged over the ARC 316 and/or the first dielectric layer 318. Further, the light filters 310 are arranged over the photodiodes 306 of corresponding pixels 302 within the openings of the composite grid 320. The light filters 310 have upper surfaces that are approximately even with an upper surface of the composite grid 320. Further, for color filters among the light filters 310, the light filters 310 are assigned corresponding colors or wavelengths of light, and configured to filter out all but the assigned colors or wavelengths of light. Typically, the color filter assignments alternate between red, green, and blue light, such that the color filters include red color filters, green color filters, and blue color filters. In some embodiments, the color filter assignments alternative between red, green, and blue light according to a Bayer filter mosaic. A pixel 302 corresponding to a red color filter is denoted as a red ("R") pixel; a pixel 302 corresponding to a blue color filter is denoted as a blue ("B") pixel; a pixel 302 corresponding to a green color filter is denoted as a green ("G") pixel; a pixel 302 corresponding to a transparent filter is denoted as a grayscale ("W") pixel. These pixels are configured for light sensing and also denoted as sensing pixels 302S. Besides the sensing pixels 302S for light sensing function, there are special pixels distributed in the pixel array not for light sensing but for providing positioning codes, denoted as positioning pixels 302P. Bottom surface of the openings of the composite grid 320 corresponding to the positioning pixels 302P is covered by opaque films 330. In some embodiments, the opaque films 330 have the same material composition as the metal grid 324, forming a continuous metal layer blocking incident light. In some embodiments, the opaque films 330 are formed of semiconductor or dielectric material. With the opaque films 330, the photodiodes 306 of corresponding positioning pixels 302P are not capable of sensing light, and the output from positioning pixels 302P is about zero (i.e., dark pixels in a fingerprint image).

A second dielectric layer 331 lining the composite grid 320 spaces the light filters 310 from the composite grid 320, and micro lenses 332 corresponding to the pixels 302 cover the light filters 310. The second dielectric layer 331 may be, for example, an oxide, such as silicon dioxide, and may be the same material or a different material than the low-n grid 326. The micro lenses 332 are centered with the photodiodes 306 of the corresponding pixels 302, and are typically symmetrical about vertical axes centered on the photodiodes 306. Further, the micro lenses 332 typically overhang the composite grid 320 around the openings so neighboring edges of the micro lenses 332 abut. The depicted embodiment shows micro lenses 332 also above the photodiodes 306 of the positioning pixels 302P. Yet in some embodiments, there may be no micro lenses 332 above the photodiodes 306 of the positioning pixels 302P.

The integrated circuit 338 includes the semiconductor substrate 304 and a device region (partially shown). The device region is arranged along a lower surface of the semiconductor substrate 304, and extends into the semiconductor substrate 304. The device region includes photodiodes 306 corresponding to the pixels 302 and logic devices, such as transistors, for readout of the photodiodes 306. The photodiodes 306 are arranged in rows and columns within the semiconductor substrate 304, and configured to accumulate charge from photons incident on the photodiodes 306. Further, the photodiodes 106 are optically isolated from each other by the DTI region 308 in the semiconductor substrate 304, thereby reducing cross talk.

A back-end-of-line (BEOL) metallization stack 340 of the integrated circuit 338 underlies the semiconductor substrate 304 and includes a plurality of metallization layers 342, 344 stacked within an interlayer dielectric (ILD) layer 346. One or more contacts 348 of the BEOL metallization stack 340 extend from a metallization layer 344 to the device region. Further, one or more first vias 350 of the BEOL metallization stack 340 extend between the metallization layers 342, 344 to interconnect the metallization layers 342, 344. The ILD layer 146 may be, for example, a low K dielectric (i.e., a dielectric with a dielectric constant less than about 3.9) or an oxide. The metallization layers 342, 344, the contacts 348, and the first vias 350 may be, for example, a metal, such as copper or aluminum.

A carrier substrate 352 underlies the integrated circuit 338 between the integrated circuit 338 and a ball grid array (BGA) 354. The BGA 354 includes a redistribution layer (RDL) 356 arranged along a lower surface of the carrier substrate 352 and electrically coupled to the metallization layers 342, 344 of the BEOL metallization stack 340 through one or more second, through silicon vias 358 extending through the carrier substrate 352. The RDL 356 is covered by a BGA dielectric layer 360, and under bump metallization (UBM) layers 362 extend through the BGA dielectric layer 360 to electrically couple solder balls 364 underlying the UBM layers 362 to the RDL 356. The BGA dielectric layer 360 may be, for example, an epoxy. The RDL 356, the UBM layers 362, the second vias 358, and the solder balls 364 may be, for example, metals, such as copper, aluminum, and tungsten. Bond pads may also be provided on the upper surface of the OFPS 300, such as the bond pads 264 discussed above with reference to FIG. 2.

Figures 4A, 4B, 4C:
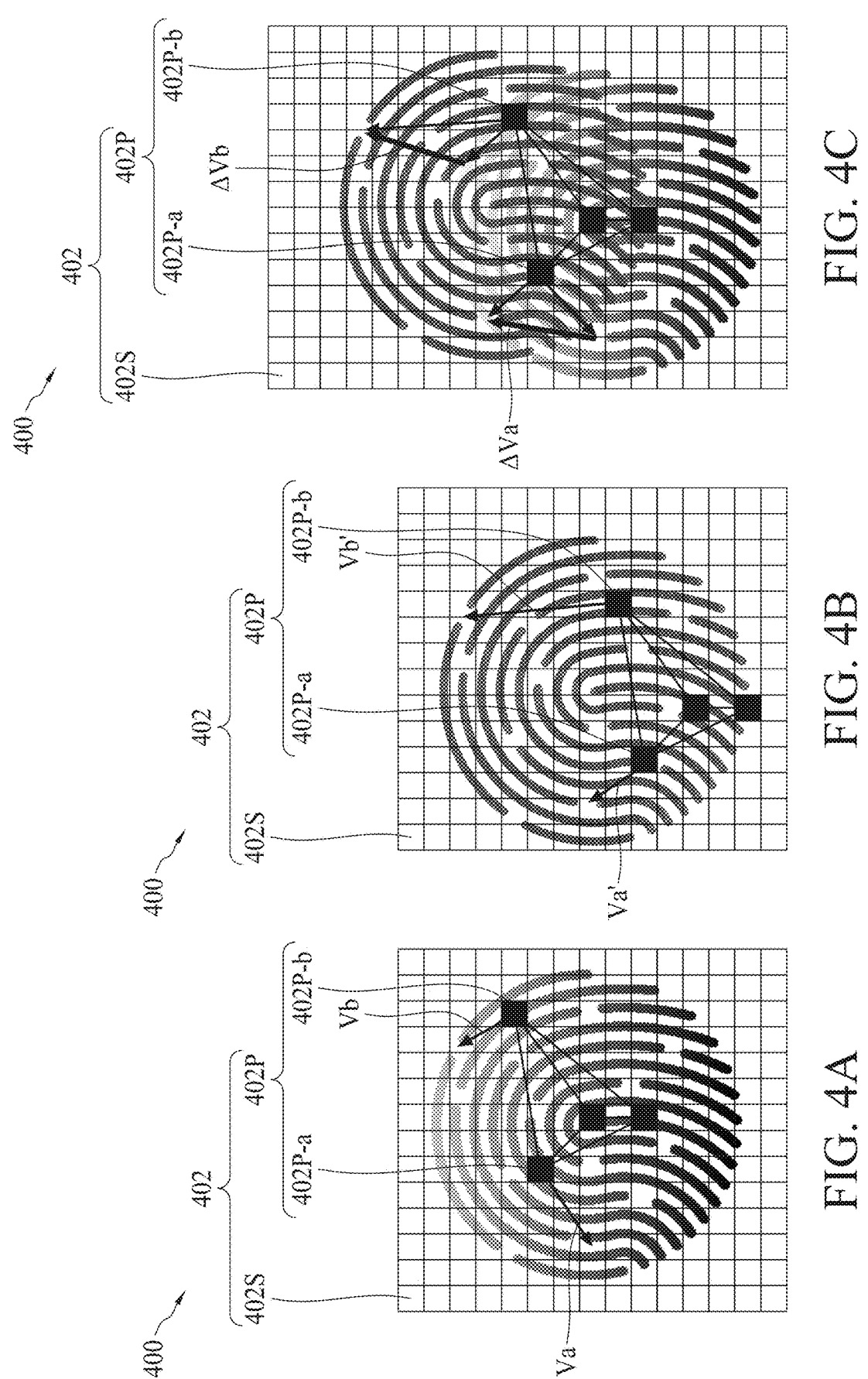
FIGS. 4A, 4B, and 4C are top views of a pixel array with positioning pixels overlaid with fingerprint images at different stages of fingerprint recognition, according to various aspects of the present disclosure.

To illustrate the function of positioning pixels in a pixel array, FIGS. 4A-4C show top views of a pixel array 400 of an OFPS at different stages of fingerprint recognition. The pixel array 400 may be substantially similar to the pixel array 336 discussed above with reference to FIG. 3. The pixel array 400 includes pixels 402 arranged in rows and columns. The pixels 402 includes sensing pixels 402S and positioning pixels 402P. The sensing pixels 402S may all be grayscale pixels, color pixels, or a combination thereof. Four positioning pixels 402P are illustrated, including a first positioning pixel 402P-a and a second positioning pixel 402P-b. Although any number of positioning pixels may present in the pixel array 400. Fingerprint images acquired by the pixel array 400 are overlaid. The sensing pixels 402S capture the light intensity variation due to ridges and valleys of a fingerprint and generate the fingerprint image. In the illustrated embodiment, the sensing pixels 402S are all grayscale pixels, and the fingerprint images are grayscale level images. Since the photodiodes of the positioning pixels 402P are shielded by an opaque film, no light intensity is sensed at the locations of the positioning pixels 402P. On the fingerprint images, black spots (dark pixels) appear at the locations of the positioning pixels 402P.

With reference to FIG. 4A, an initial fingerprint image is acquired as the reference fingerprint image and stored in a memory (or database). Characteristics (minutia points) of the fingerprint arc positioned with reference to positioning pixels in the form of vectors. FIG. 4A illustrates a first vector Va, which marks a first minutia point located at a first location at one of the ridge lines with reference to the first positioning pixel 402P-a, and a second vector Vb, which makes a second minutia point at a second location at another one of the ridge lines with reference to the second positioning pixel 402P-b. The reference fingerprint image with the vectors referenced to positioning pixels are recorded.

With reference to FIG. 4B, a new fingerprint image is acquired when the user's identify needs to be verified. The user's finger may not land on the exact same location as last time, and the acquired fingerprint image may be shifted with respect to the reference fingerprint image. Characteristics (minutia points) of the acquired fingerprint are positioned again with reference to positioning pixels in the form of vectors. FIG. 4B illustrates a third vector Va', which marks the same first minutia point as in FIG. 4A but shifted with reference to the first positioning pixel 402P-a, and a fourth vector Vb', which marks the same second minutia point as in FIG. 4A but shifted with reference to the second positioning pixel 402P-b.

With reference to FIG. 4C, the acquired fingerprint image is compared to the reference fingerprint image stored in the memory. Instead of a direction comparison of the collection of characteristics (minutia map) of the fingerprints, which is easier to be counterfeited, it is the vectors to be compared. For example, the third vector Va' is compared to the first vector Va, and a shift ΔVa in the form of vector is calculated. The fourth vector Vb' is compared to the second vector Vb, and a shift ΔVb in the form of vector is calculated. Then, the shift ΔVa is compared to the shift ΔVb. The shift ΔVa should be equal to the shift ΔVb (as well as many other vectors not iterated herein) to conclude a match.

Figure 5:
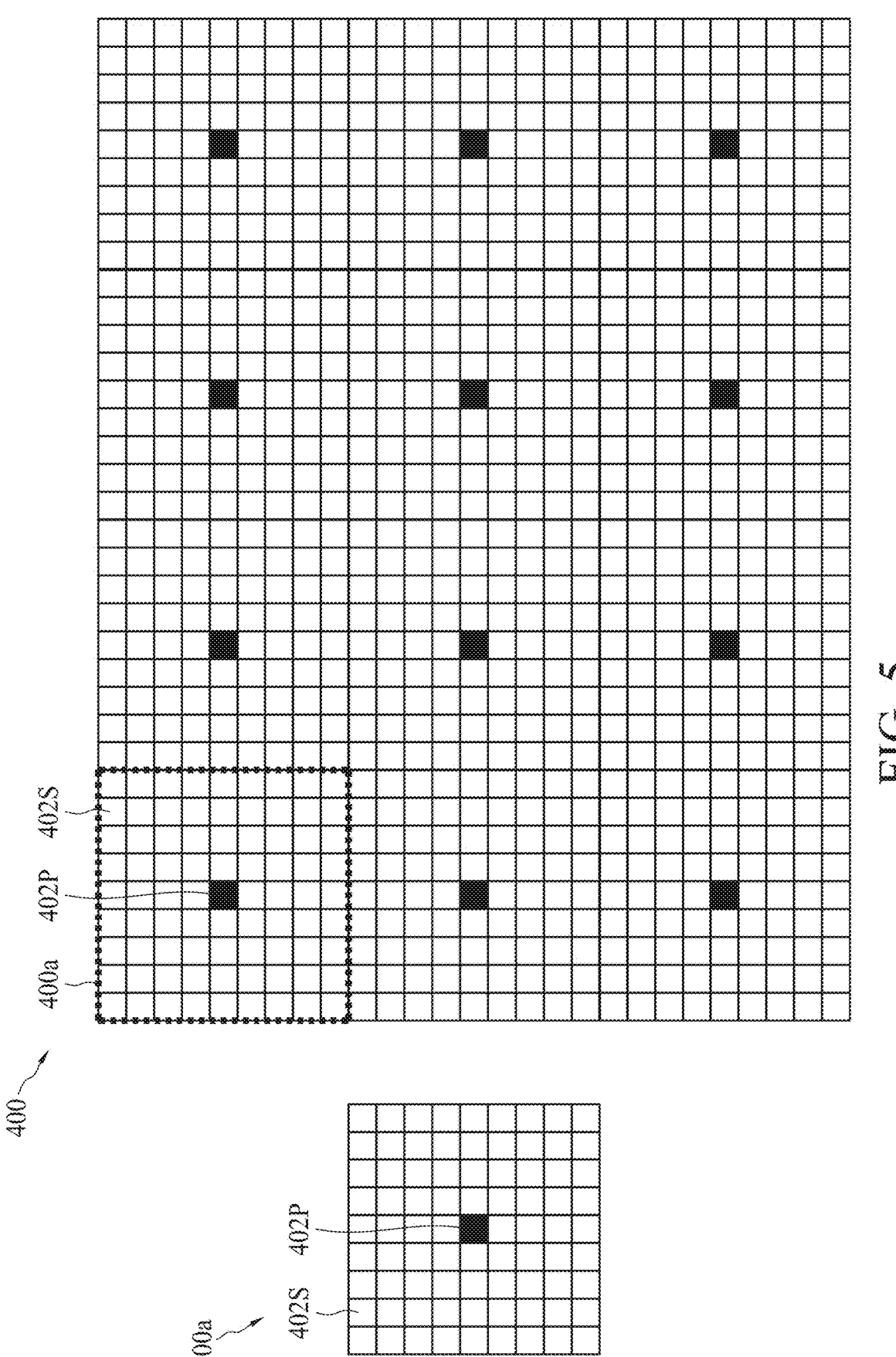
FIGS. 5, 6, and 7 illustrate embodiments of the distribution of positioning pixels in a pixel array, according to various aspects of the present disclosure.
Figure 6:
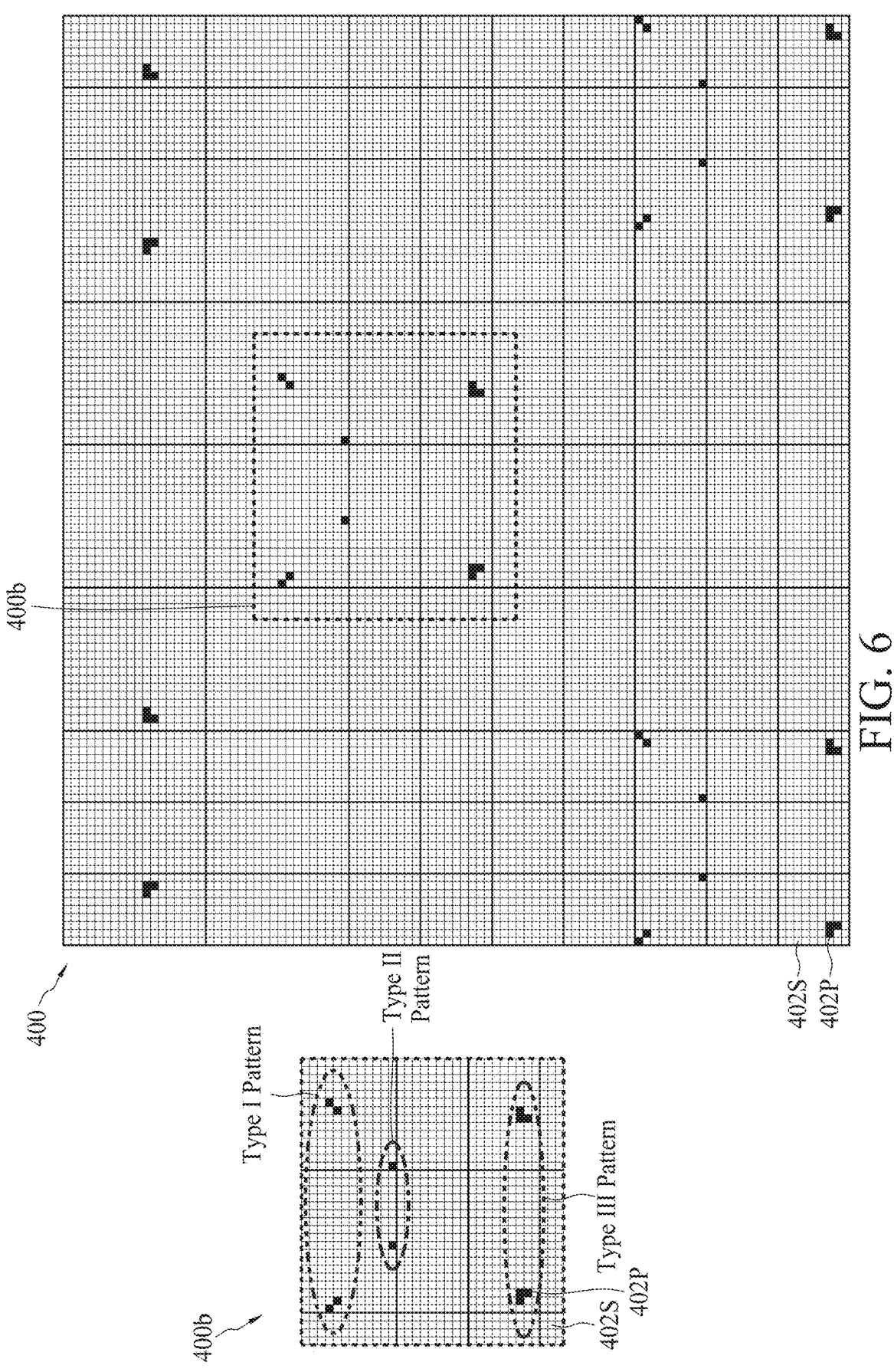
Figure 7:
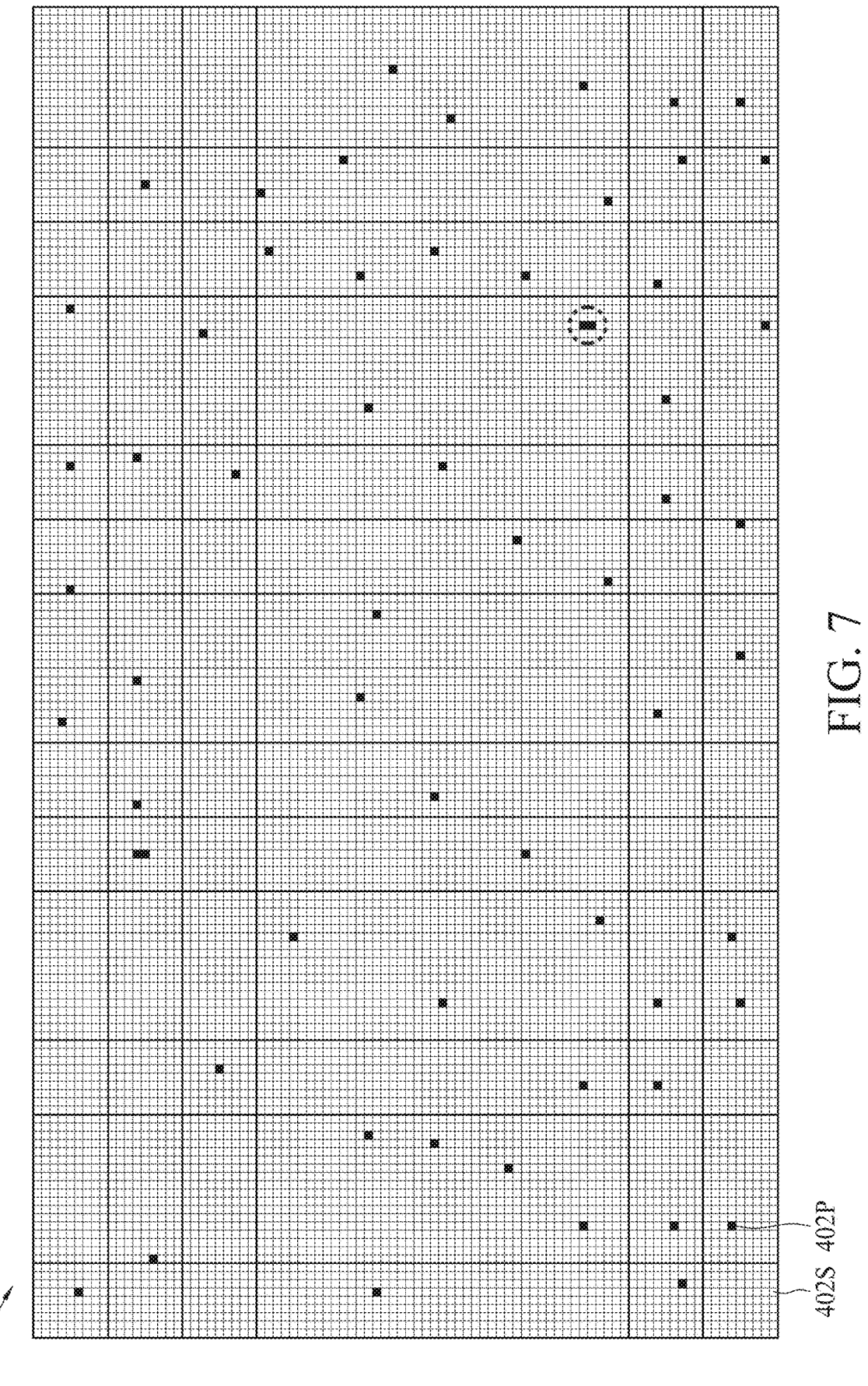

FIGS. 5-7 illustrate various embodiments of the distribution of positioning pixels 402P in the pixel array 400. With reference to FIG. 5, the pixel array 400 may be constructed with the repeating of a unit tile (or tile) 400a in columns and rows. The tile 400a includes sensing pixels 402S and a positioning pixel 402P in its center. Thus, the positioning pixels 402P are repeatedly arranged in the pixel array 400. That is, the positioning pixels 402P have a regular pattern.

With reference to FIG. 6, the pixel array 400 may be constructed with the repeating of a unit tile 400*b* in columns and rows. The tile 400*b* includes sensing pixels 402S and a plurality of positioning pixels 402P. Based on the arrangement of adjacent positioning pixels 402P, the positioning pixels 402P may be classified in different types of patterns. In the illustrated embodiment, the type I pattern comprises two adjacent positioning pixels 402P arranged diagonally, the type II pattern comprises isolated positioning pixels 402P, and the type III pattern comprises three adjacent positioning pixels 402P forming a triangle shape. Due to the repeating of the tile 400*b*, the different types of patterns of the positioning pixels 402P are also repeatedly arranged in the pixel array 400. That is, the positioning pixels 402P have a regular pattern. The different types of patterns of the positioning pixels 402P provides further enhanced anti-counterfeiting features. For example, the vector comparison may be carried out in the type I pattern, type II pattern, and type II pattern individually, and the shifts should pass tests within each of the type I pattern, type II pattern, and type III pattern. Then, the shifts from each of the type I pattern, type II pattern, and type III pattern are compared, and should be the same to eventually conclude a match. That is, the vector comparison may conclude the same shift $\Delta V_{type\text{-}I}$ based on the type I pattern of the positioning pixels 402P, the same shift $\Delta V_{type\text{-}II}$ based on the type II pattern of the positioning pixels 402P, and the same shift $\Delta V_{type\text{-}III}$ based on the type III pattern of the positioning pixels 402P, and still further, the shifts $\Delta V_{type\text{-}I}$, $\Delta V_{type\text{-}II}$, and $\Delta V_{type\text{-}III}$ should also equal to conclude a match.

With reference to FIG. 7, the positioning pixels 402P may be randomly distributed in the pixel array 400. That is, the positioning pixels 402P may have a random pattern. Still, adjacent positioning pixels 402P may form various types of patterns even overall randomly distributed in the pixel array 400. For example, the dashed circle in FIG. 7 highlights two adjacent positioning pixels 402P in forming a line shape pattern, besides other isolated positioning pixels 402P. The combination increases the difficulty of counterfeiting. In various embodiments, such as in FIGS. 5-7, the percentage of positioning pixels 402P in the total amount pixels in the pixel array 400 may range from about 1% to about 10%. This range is not trivial. If the percentage of the positioning pixels is below 1%, the anti-counterfeiting feature may not be enhanced sufficiently; if the percentage of the positioning pixels is above 10%, the area of the pixel array may not be sufficiently utilized for fingerprint image capture. In other words, a fingerprint image captured by the pixel array implementing positioning pixels may have dark pixel in an area percentage of 1% to about 10% of the total area of the fingerprint image.

Figures 8A, 8B, 8C, 8D:
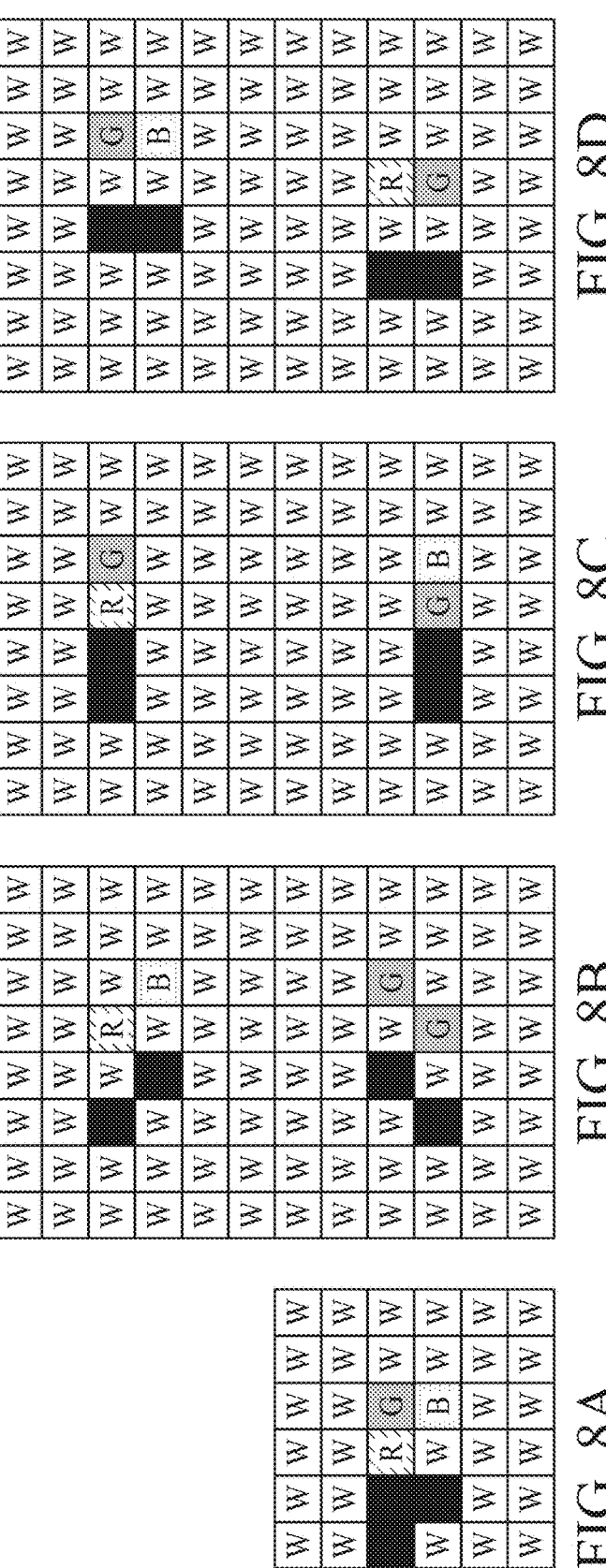
FIGS. 8A, 8B, 8C, 8D, 8E, 8F, and 8G illustrate embodiments of the distribution of positioning pixels and color pixels in a pixel array, according to various aspects of the present disclosure.
Figure 8E:
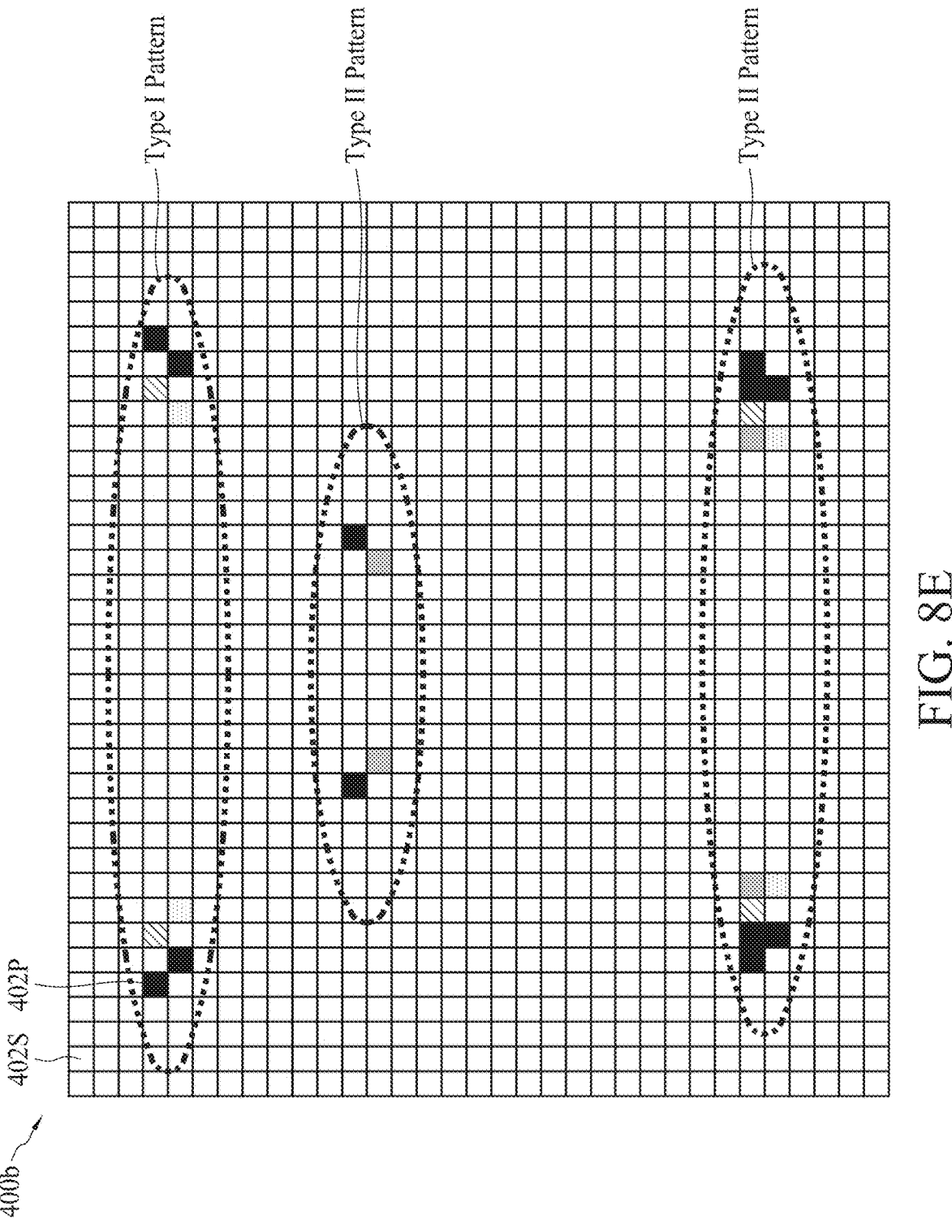
Figure 8F:
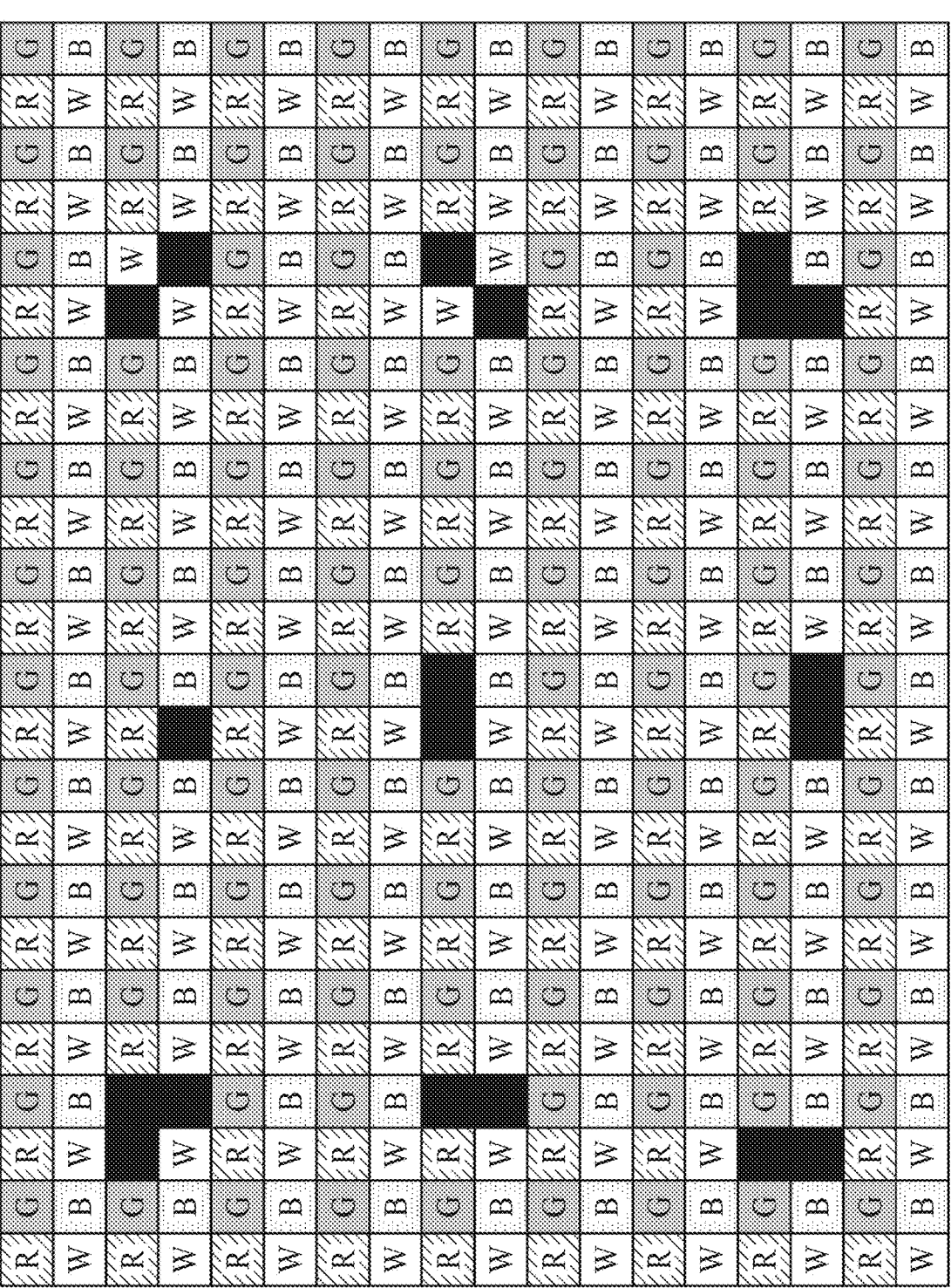
Figure 8G:
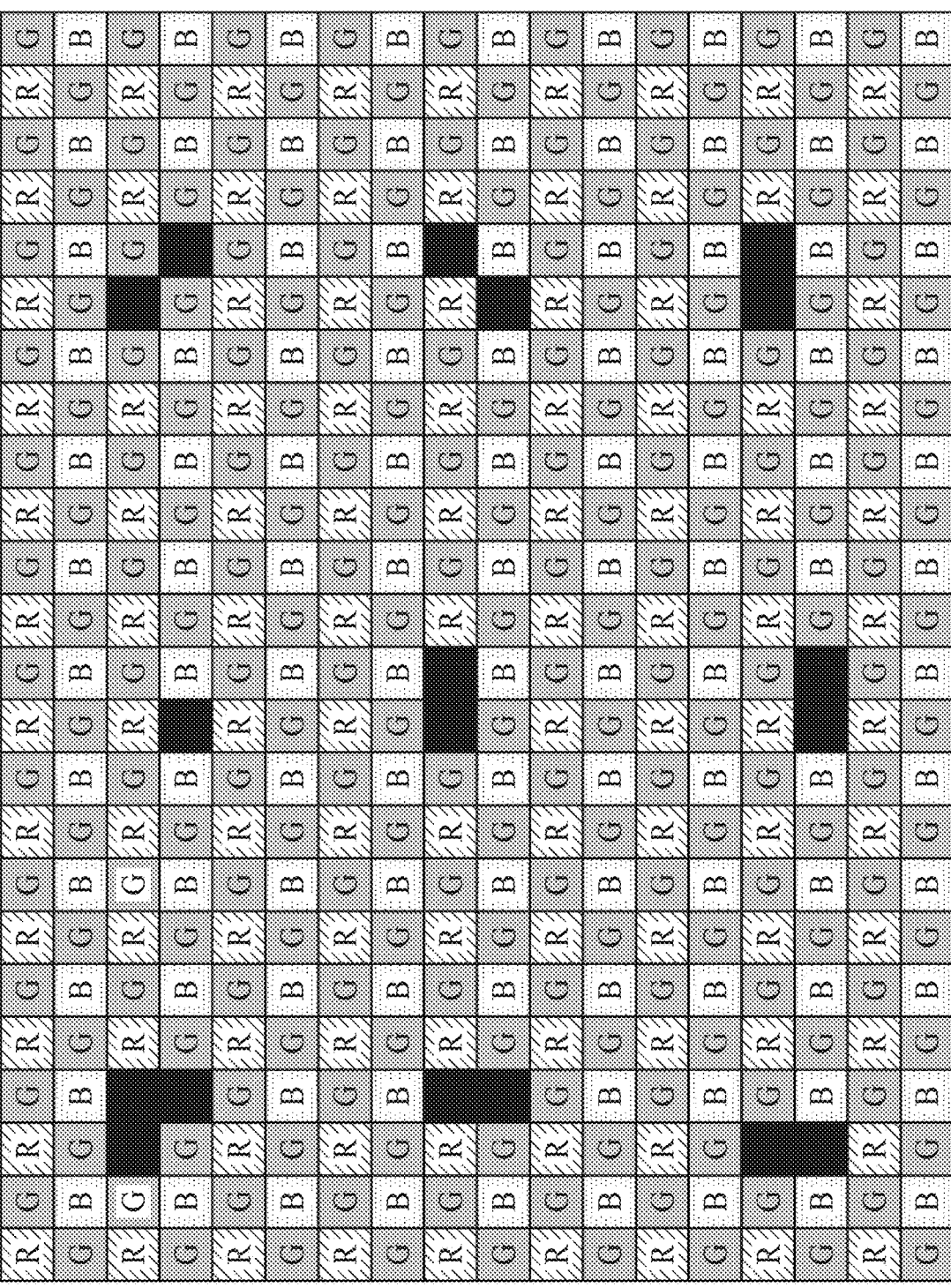

Besides the positioning pixels, color pixels may be added to a grayscale pixel array to add skin tone information of the fingerprint. Skin tone information adds another layer of security beyond comparing minutia points of the fingerprints. FIGS. 8A-8G illustrate various embodiments of adding a plurality of color pixels to an array of otherwise all grayscale pixels (denoted as "W"). The positioning pixels also help to identify positions of the color pixels by locating the color pixels next to the positioning pixels. This helps a software algorithm to quickly identify from a fingerprint image where the color pixels locate. The color pixels may also form the same type of pattern as the positioning pixels. With reference to FIG. 8A, three positioning pixels form a triangle shape, and three color pixels of red, green, and blue (RGB) are arranged in the same shape and located next to the positioning pixels. With reference to FIG. 8B, two positioning pixels form a diagonal line shape, and two color pixels (e.g., RB, GG, or other suitable combinations) are arranged in the same shape and located next to the positioning pixels. With reference to FIG. 8C, two positioning pixels form a horizontal line shape, and two color pixels (e.g., RG, GB, or other suitable combinations) are arranged in the same shape and located next to the positioning pixels. With reference to FIG. 8D, two positioning pixels form a vertical line shape, and two color pixels (e.g., GB, RG, or other suitable combinations) are arranged in the same shape and located next to the positioning pixels with a column of grayscale pixels therebetween. With reference to FIG. 8E, the tile 400*b* as discussed above with reference to FIG. 6 is reproduced with added color pixels. The color pixels are added next to the positioning pixels with the same types of patterns. In the illustrated embodiment, the type I pattern comprises two adjacent positioning pixels arranged diagonally and two adjacent color pixels arranged diagonally, the type II pattern comprises isolated positioning pixels with adjacent isolated color pixels, and the type III pattern comprises three adjacent positioning pixels forming a triangle shape and three adjacent color pixels forming a triangle shape. With reference to FIG. 8F, the color pixels may even outnumber the grayscale pixels, and the grayscale pixels outnumber the positioning pixels. In the illustrated embodiment, the grayscale pixels only appear in every other row and every other column with color pixels filling remaining pixels not taken by positioning pixels, and the positioning pixels are randomly distributed or repeatedly distributed. With reference to FIG. 8G, all the sensing pixels in the pixel array may be color pixels, and the positioning pixels are randomly distributed or repeatedly distributed. Any other suitable combinations and arrangements of positioning pixels and color pixels are possible beyond what are illustrated in FIGS. 8A-8G, as will be appreciated by those skilled in the art.

Figure 9:
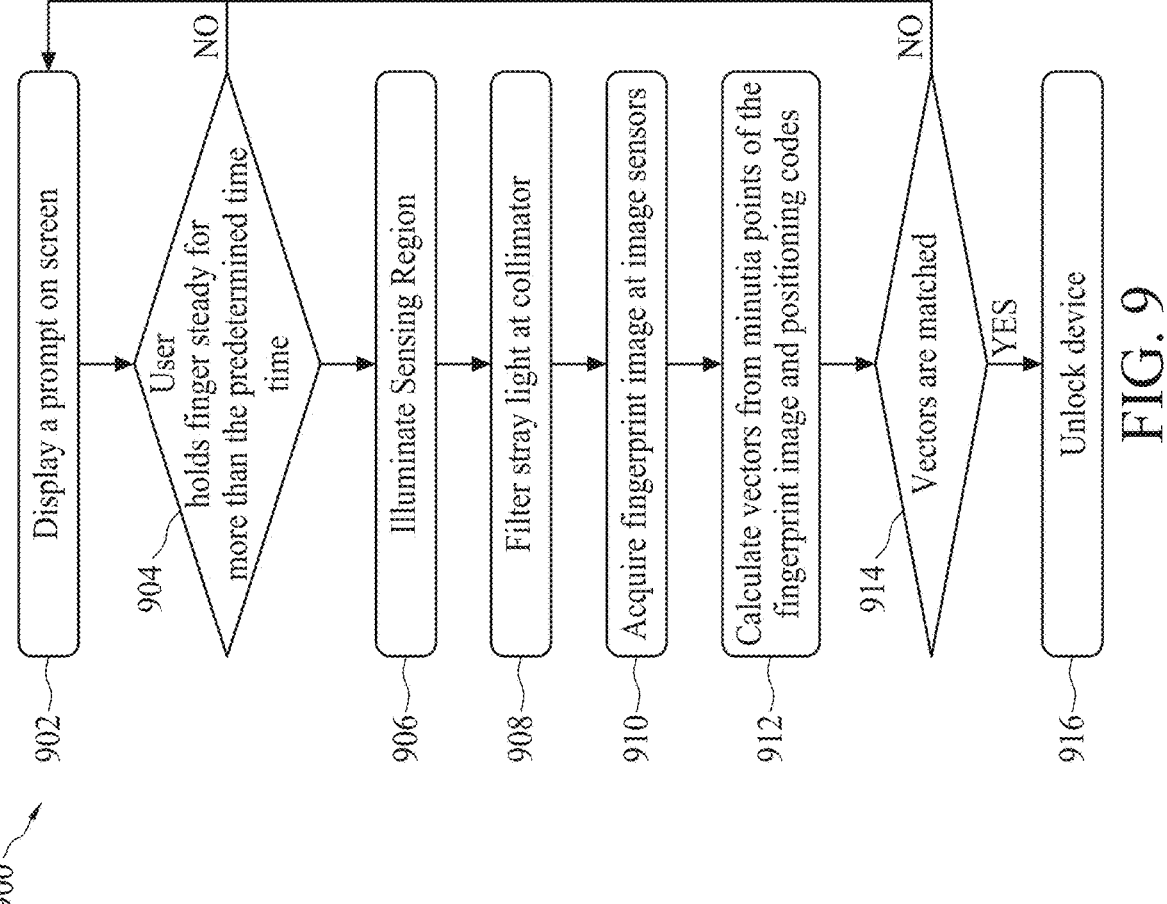
FIG. 9 illustrates a flowchart of a method for fingerprint recognition, according to various aspects of the present disclosure.

FIG. 9 shows a flowchart of a method 900 for capturing and recognition of a fingerprint image from a user's finger illuminated by a display panel integrated with an OFPS, according to examples of the disclosure. The method 900 will be described below with references to the exemplary electronic device 100 illustrated in FIG. 2.

At block 902, the method 900 begins with displaying a prompt on the screen. The screen of the electronic device 100 may be in a lock status. The prompt may be an icon, such as a fingerprint icon or an instruction text. The prompt highlights a sensing region 108 on the screen. The prompt is shown by light emitting pixels 222 under the sensing region 208. The light emitting pixels 222 can be OLED diodes. The light emitting pixels 222 outside of the sensing region 108 may be turned off in the lock status or display preset screen saver images.

At block 904, the method 900 detects an input object shown up in the sensing region 108, such as the user's finger 110. The detection may be implemented by sensing the incident light variation at the optical sensing elements 207. Alternatively, the display panel 202 may be a touch screen and include touch sensor(s), and the detection may be implemented by the touch sensor(s). In some applications, the user's finger 110 is not necessary to physically touch the top surface 216 of the display panel 202. Instead, a near-field imaging can be used for sensing touches detected through a user's glove or other barriers such as oils, gels, and moisture. When the user's finger 110 stays steady for more than a predetermined time, such as the user holding a finger steady for about one hundred milliseconds, the method 900 enters a biometric detection mode. Otherwise, the method 900 returns to block 902, waiting for a new user input.

At block 906, the prompt shown on the screen is turned off and the light emitting pixels 222 under the sensing region 208 start to illuminate the user's finger 110. The light 270 emitted from the light emitting pixels 222 travels through the cover glass 214 and arrives at the user's finger 110. The user's finger 110 can include ridges 272 and valleys 274. The ridges 272 of the finger can reflect more light due to a closer distance to the top surface 216 than the valleys 274, and the valleys 274 can reflect less light. The light 270 is in turn reflected back towards the light conditioning layer 204.

At block 908, method 400 filters stray light components in the light 270 at the collimator 240. With high aspect ratio of the apertures 246, the collimator 240 only allows light rays reflected from the sensing region 108 at normal or near normal incidence to the collimator 240 to pass and eventually reach the image sensing layer 206. The optical sensing element 207 can be used to measure the intensity of light and convert the measured intensity into pixel image of the user's finger 110. On the other hand, stray light with a larger angle from normal, strike the collimator 240, either on its top surface or at surface within the apertures 246 (e.g., aperture sidewalls) and are blocked and prevented from reaching the image sensing layer 206 below. The aspect ratio of the apertures 246 is sufficiently large to prevent stray light from traveling through the collimator 240, such as from about 5:1 to about 50:1. As an example, a light ray reflected from the valley 274 may travel in a large angel to norm direction and arrive at one sensor element directly under the ridge 272 in the absence of the collimator 240. The image produced by the one sensor element is therefore blurred due to mixing the lights from regions of the ridge 272 and the valley 274. Such a light ray is referred to as stray light. Larger aspect ratios of the apertures 246 restrict the light acceptance cone to smaller angles, improving the optical resolution of the system. In some embodiments, the apertures 246 are cylindrical or conical in shape. The sidewalls of the apertures 246 may further include grooves or other structures to prevent stray light from reflecting off the walls and reaching the OFPS 206 below.

At block 910, the method 900 acquires a fingerprint image at the OFPS 206. The sensing pixels 207 in the pixel array of the image sensing layer 206 convert the incident light into electrical outputs. The pixel array may comprise sensing pixels that are monochromatic (grayscale) pixels, color pixels, or a combination of monochromatic pixels and color pixels. The color pixels add skin tone information to the fingerprint image. The pixel array also includes positioning pixels uniformly or randomly distributed in the pixel array. Each sensing pixel 207's output may correspond to one pixel with grayscale level (or RGB color if color pixel presented) in the fingerprint image. Each positioning pixel's output may correspond to one dark pixel in the fingerprint image. In some embodiments, each of the sensing pixel may be configured to correspond with specific light wavelengths, such as a sensing pixel under a red light emitting pixel (222R) for sensing a red light wavelength, a sensing pixel under a green light emitting pixel (222G) for sensing a green light wavelength, and a sensing pixel under a blue light emitting pixel (222B) for sensing a blue light wavelength.

At block 912, the method 900 acquires vectors representing characteristics (minutia points) of a fingerprint with respect to locations of the positioning pixels. Based on the types of the patterns of the positioning pixels, the vectors may also be classified into different groups, such as a first group of vectors with reference to positioning pixels of a first type of pattern and a second group of vectors with reference to positioning pixels of a second type of pattern.

At block 914, the method 900 compares the acquired fingerprint image with an authentic reference image previously stored in a memory (or a database). The comparison includes comparing the vectors of the two images. The comparison of the vectors may be addition to the comparison of the minutia maps at block 914, adding another layer of security to minutia maps alone. Alternatively, it may be just vectors being compared at block 914. The vectors might not be the same, as the fingerprint may shift with respect to the positioning pixels, but the shifts of the vectors should be the same to conclude a match. Further, if the vectors are classified into different groups (types of patterns), two levels of comparisons can be performed. The lower level is to compare vectors and shifts of the vectors in the same group, which should be the same. The higher level is to compare vectors and shifts across different groups, which should also be the same to conclude a match. The skin tone information can optionally be another criteria to compare in order to conclude a match. If the fingerprint images match, the method 900 proceeds to block 916 to unlock the screen. The light emitting pixels 222 under the sensing region 108 will stop illumination and join the other light emitting pixels 222 outside of the sensing region 108 to start display regular desktop icons as in an unlock status. If the fingerprint images do not match, the method 900 proceeds back to block 902 to wait for new biometric detection.

Although not intended to be limiting, one or more embodiments of the present disclosure provide many benefits to a fingerprint recognition system, such as in consumer (or portable) electronic devices. For example, some of the sensing pixels in a pixel array is replaced with positioning pixels distributed in certain patterns. The positioning pixels provide reference points to identify characteristics of an acquired fingerprint and optionally indicate locations of adjacent color pixels for providing skin tone information. Anti-counterfeiting capability of the fingerprint recognition system is further enhanced.

In one exemplary aspect, the present disclosure is directed to an image sensing apparatus. In some embodiments, the image sensing apparatus includes a pixel array and a plurality of micro lenses disposed above the pixel array. The pixel array includes a plurality of sensing pixels configured to capture minutia points of a fingerprint, and a plurality of positioning pixels configured to provide positioning codes. In some embodiments, all the sensing pixels are grayscale pixels. In some embodiments, all the sensing pixels are color pixels. In some embodiments, the sensing pixels includes a plurality of grayscale pixels and a plurality of color pixels. In some embodiments, the color pixels are positioned adjacent to the positioning pixels. In some embodiments, the color pixels are arranged in a pattern same to a pattern formed by the adjacent positioning pixels. In some embodiments, the positioning pixels are arranged in a repeated pattern in the pixel array. In some embodiments, the positioning pixels are distributed randomly in the pixel array. In some embodiments, the image sensing apparatus further includes a collimator above the micro lenses and an illumination layer above the collimator. In some embodiments, the micro lenses are disposed directly above the sensing pixels but not above the positioning pixels.

In another exemplary aspect, the present disclosure is directed to an optical fingerprint sensor. In an embodiment, the optical fingerprint sensor includes an array of light filters arranged in columns and rows, an array of light receiving elements under the array of light filters, where the array of light receiving element is configured to convert incident light reflected from a fingerprint to a fingerprint image, and a plurality of opaque films disposed above a portion of the light receiving elements, where the portion of the light receiving elements is configured to add dark pixels to the fingerprint image. In some embodiments, the opaque films are made of metal. In some embodiments, the opaque films are disposed between the array of light filters and the array of light receiving elements. In some embodiments, locations of the portion of the light receiving elements form a regular pattern. In some embodiments, inside the regular pattern, the portion of the light receiving elements form at least two different sub patterns. In some embodiments, locations of the portion of the light receiving elements are distributed randomly. In some embodiments, the array of light filters includes a combination of color filters and transparent filters.

In yet another exemplary aspect, the present disclosure is directed to a method of fingerprint verification. In some embodiment, the method includes capturing a fingerprint image by an image sensing device, the image sensing device including a pixel array of a combination of sensing pixels configured to capture minutia points in the fingerprint image and positioning pixels configured to provide positioning codes, calculating vectors of the minutia points with reference to the positioning codes, and comparing the vectors to reference vectors generated from a reference fingerprint image to determine a match between the fingerprint image and the reference fingerprint image. In some embodiments, the vectors include a first group of vectors with reference to a first type of the positioning codes and a second group of vectors with reference to a second type of the positioning codes. In some embodiments, the method further includes determining shifts between the vectors and the reference vectors and determining whether the shifts are substantially equal to determine the match.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fingerprint verification, comprising:
capturing a fingerprint image by an image sensing device, the image sensing device including a pixel array of a combination of sensing pixels configured to capture minutia points in the fingerprint image and positioning pixels configured to provide positioning codes, wherein the positioning pixels are dark pixels;
calculating vectors of the minutia points with reference to the positioning codes;
comparing the vectors to reference vectors generated from a reference fingerprint image, wherein the positioning codes are insensitive to information in either the fingerprint image or the reference fingerprint image; and
determining a match between the fingerprint image and the reference fingerprint image based on the comparing of the vectors.

2. The method of claim 1, wherein the determining of the match includes:
determining shifts between the vectors and the reference vectors; and
determining whether the shifts are substantially equal to conclude the match.

3. The method of claim 1, wherein the vectors include a first group of vectors with reference to a first type of the positioning codes and a second group of vectors with reference to a second type of the positioning codes.

4. The method of claim 3, wherein the determining of the match includes:
determining first shifts between the first group of vectors with corresponding ones of the reference vectors;
determining whether the first shifts are substantially equal to conclude a first low level match;
determining second shifts between the second group of vectors with corresponding ones of the reference vectors; and
determining whether the second shifts are substantially equal to conclude a second low level match,
wherein the match is concluded upon at least conclusion of both the first low level match and the second low level match.

5. The method of claim 4, wherein the determining of the match further includes:
determining whether the first shifts and the second shifts are substantially equal to conclude a high level match,
wherein the match is concluded additionally upon conclusion of the high level match.

6. The method of claim 1, further comprising:
comparing the minutia points in the fingerprint image to minutia points in the reference fingerprint image,
wherein the determining of the match is additionally based on the comparing of the minutia points.

7. The method of claim 1, wherein the determining of the match is solely based on the comparing of the vectors.

8. The method of claim 1, wherein the sensing pixels include color pixels configured to provide a skin tone of the fingerprint image, the method further comprising:
comparing the skin tone of the fingerprint image to a reference skin tone of the reference fingerprint image.

9. The method of claim 8, wherein the determining of the match is additionally based on the comparing of the skin tone.

10. A method of biometric sensing, comprising:
acquiring an image of an object by a biometric sensing device, the biometric sensing device including a pixel array of a combination of sensing pixels and positioning pixels, wherein the positioning pixels are dark pixels;
retrieving minutia points from the acquired image;
calculating vectors of the minutia points with reference to the positioning pixels;
calculating shifts by comparing the vectors to reference vectors generated from a reference image, wherein the positioning pixels are insensitive to information in either the acquired image or the reference image; and
determining a match between the acquired image and the reference image by evaluating consistency of the shifts.

11. The method of claim 10, wherein the determining of the match is based on the shifts being substantially equal.

12. The method of claim 10, wherein each of the shifts is in format of a vector.

13. The method of claim 10, wherein the positioning pixels include a first subset corresponding to a first type of pattern arrangement and a second subset corresponding to a second type of pattern arrangement.

14. The method of claim 13, wherein the calculating of the shifts includes:

calculating a first group of the shifts corresponding to the first subset of the positioning pixels; and calculating a second group of the shifts corresponding to the second subset of the positioning pixels.

15. The method of claim 14, wherein the evaluating consistency of the shifts includes:

evaluating a first consistency of the first group of the shifts; and evaluating a second consistency of the second group of the shifts.

16. A method of fingerprint verification, comprising:

capturing a fingerprint image by an image sensing device, the image sensing device including a pixel array of a combination of monochromatic pixels configured to capture a minutia map of the fingerprint image, color pixels configured to capture a skin tone of the fingerprint image, and positioning pixels configured to provide vectors of minutia points in the minutia map with reference to the positioning pixels;

comparing the minutia map to a reference minutia map of a reference fingerprint image;

comparing the skin tone to a reference skin tone of the reference fingerprint image;

evaluating consistency of shifts between the vectors and reference vectors of the reference fingerprint image; and determining a match between the fingerprint image and the reference fingerprint image based on the comparing of the minutia map, the comparing of the skin tone, and the evaluating of the consistency.

17. The method of claim 16, wherein the monochromatic pixels outnumbers either of the color pixels and the positioning pixels.

18. The method of claim 16, wherein the color pixels outnumber the monochromatic pixels, and the monochromatic pixels outnumber the positioning pixels.

19. The method of claim 16, wherein the color pixels are positioned adjacent to the positioning pixels.

20. The method of claim 19, wherein the color pixels are arranged in a pattern same to a pattern formed by the adjacent positioning pixels.

\* \* \* \* \*